(12) United States Patent
Hohlfeld et al.

(10) Patent No.: US 11,978,700 B2
(45) Date of Patent: May 7, 2024

(54) POWER SEMICONDUCTOR MODULE ARRANGEMENT

(71) Applicant: Infineon Technologies AG, Neubiberg (DE)

(72) Inventors: Olaf Hohlfeld, Warstein (DE); Peter Kanschat, Soest (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/872,255

(22) Filed: Jul. 25, 2022

(65) Prior Publication Data

US 2022/0359365 A1    Nov. 10, 2022

Related U.S. Application Data

(60) Continuation of application No. 16/951,556, filed on Nov. 18, 2020, now Pat. No. 11,437,311, which is a
(Continued)

(30) Foreign Application Priority Data

Dec. 15, 2017 (EP) ..................................... 17207680

(51) Int. Cl.
*H01L 21/00* (2006.01)
*H01L 21/56* (2006.01)
(Continued)

(52) U.S. Cl.
CPC ...... *H01L 23/49861* (2013.01); *H01L 21/568* (2013.01); *H01L 23/24* (2013.01);
(Continued)

(58) Field of Classification Search
CPC . H01L 23/49861; H01L 21/568; H01L 23/24; H01L 23/3107
See application file for complete search history.

(56) References Cited

U.S. PATENT DOCUMENTS

| | | | |
|---|---|---|---|
| 5,362,775 A | 11/1994 | Shintai et al. | |
| 6,313,524 B1 * | 11/2001 | Pueschner | H05K 3/284 |
| | | | 29/841 |

(Continued)

FOREIGN PATENT DOCUMENTS

| | | | | |
|---|---|---|---|---|
| CN | 109935574 A | * | 6/2019 | ........... H01L 21/568 |
| CN | 111900134 A | * | 11/2020 | ......... H01L 21/4817 |

(Continued)

*Primary Examiner* — Laura M Menz
(74) *Attorney, Agent, or Firm* — Murphy, Bilak & Homiller, PLLC

(57) ABSTRACT

A power semiconductor module arrangement includes two or more individual semiconductor devices arranged on a base layer. Each semiconductor device includes a lead frame, a semiconductor body arranged on the lead frame, and a molding material enclosing the semiconductor body and at least part of the lead frame. A frame is arranged on the base layer such that the frame surrounds the two or more individual semiconductor devices. A casting compound at least partly fills a capacity formed by the base layer and the frame, such that the casting compound at least partly encloses the two or more individual semiconductor devices.

15 Claims, 8 Drawing Sheets

Related U.S. Application Data division of application No. 16/220,956, filed on Dec. 14, 2018, now Pat. No. 10,867,902.

(51) Int. Cl.
| | |
|---|---|
| *H01L 23/24* | (2006.01) |
| *H01L 23/31* | (2006.01) |
| *H01L 23/367* | (2006.01) |
| *H01L 23/40* | (2006.01) |
| *H01L 23/498* | (2006.01) |
| *H01L 25/07* | (2006.01) |
| *H01L 23/00* | (2006.01) |

(52) U.S. Cl.
CPC ...... *H01L 23/3107* (2013.01); *H01L 23/3135* (2013.01); *H01L 23/3672* (2013.01); *H01L 23/4006* (2013.01); *H01L 23/49844* (2013.01); *H01L 25/072* (2013.01); *H01L 23/564* (2013.01); *H01L 2224/48091* (2013.01); *H01L 2224/73265* (2013.01); *H01L 2924/13055* (2013.01); *H01L 2924/13062* (2013.01); *H01L 2924/13064* (2013.01); *H01L 2924/13091* (2013.01)

(56) References Cited

U.S. PATENT DOCUMENTS

| | | | | |
|---|---|---|---|---|
| 6,576,995 | B2* | 6/2003 | Hogerl | H01L 23/49838 |
| | | | | 257/784 |
| 7,666,715 | B2* | 2/2010 | Brunner | H01L 31/0203 |
| | | | | 257/E33.059 |
| 9,349,709 | B2 | 5/2016 | Hoegerl et al. | |
| 9,437,513 | B2* | 9/2016 | Fuergut | H01L 23/3157 |
| 10,043,782 | B2 | 8/2018 | Fuergut et al. | |
| 10,867,902 | B2* | 12/2020 | Hohlfeld | H01L 23/3672 |
| 11,049,790 | B2* | 6/2021 | Fuergut | H01L 23/3675 |
| 11,437,311 | B2* | 9/2022 | Hohlfeld | H01L 23/49811 |
| 11,462,446 | B2* | 10/2022 | Hoehn | H01L 23/053 |
| 11,533,824 | B2* | 12/2022 | Nottelmann | H05K 1/181 |
| 11,581,230 | B2* | 2/2023 | Ludwig | H01L 23/06 |
| 2001/0030359 | A1* | 10/2001 | Hogerl | H01L 23/24 |
| | | | | 257/E23.07 |
| 2005/0045369 | A1 | 3/2005 | Ishimaru et al. | |
| 2006/0202323 | A1 | 9/2006 | Shinohara | |
| 2007/0126131 | A1* | 6/2007 | Mueller | H01L 21/565 |
| | | | | 257/E21.504 |
| 2008/0054288 | A1* | 3/2008 | Harrah | H01L 33/64 |
| | | | | 257/E33.059 |
| 2009/0072333 | A1* | 3/2009 | Haag | G01L 19/148 |
| | | | | 438/51 |
| 2011/0058342 | A1 | 3/2011 | Kawakita et al. | |
| 2013/0010442 | A1* | 1/2013 | Heim | H05K 3/202 |
| | | | | 361/752 |
| 2013/0161801 | A1 | 6/2013 | Otremba et al. | |
| 2013/0203895 | A1* | 8/2013 | Dershem | C08G 59/5073 |
| | | | | 548/338.1 |
| 2014/0001613 | A1 | 1/2014 | Ha | |
| 2014/0103377 | A1* | 4/2014 | Krauter | H01L 33/60 |
| | | | | 438/26 |
| 2015/0076672 | A1* | 3/2015 | Hosseini | H01L 23/49838 |
| | | | | 438/107 |
| 2015/0102479 | A1* | 4/2015 | Fuergut | H01L 21/3105 |
| | | | | 257/706 |
| 2015/0380335 | A1* | 12/2015 | Takematsu | H01L 24/01 |
| | | | | 257/77 |
| 2016/0372399 | A1* | 12/2016 | Fuergut | H01L 23/4334 |
| 2017/0287880 | A1 | 10/2017 | Fuergut et al. | |
| 2018/0012947 | A1* | 1/2018 | Lee | H01L 27/1222 |
| 2018/0350780 | A1 | 12/2018 | Fuergut et al. | |
| 2019/0013269 | A1 | 1/2019 | Zhang et al. | |
| 2019/0189553 | A1* | 6/2019 | Hohlfeld | H01L 23/3672 |
| 2020/0357710 | A1* | 11/2020 | Hoehn | H01L 23/49811 |
| 2021/0074624 | A1* | 3/2021 | Hohlfeld | H01L 23/3135 |
| 2021/0358820 | A1* | 11/2021 | Ludwig | H01L 23/06 |
| 2021/0400838 | A1* | 12/2021 | Nottelmann | H01L 23/4006 |
| 2022/0359319 | A1* | 11/2022 | Hoehn | H01L 23/49811 |
| 2022/0359365 | A1* | 11/2022 | Hohlfeld | H01L 25/072 |
| 2023/0124688 | A1* | 4/2023 | Nottelmann | H01L 25/072 |
| | | | | 361/720 |
| 2023/0170287 | A1* | 6/2023 | Nolten | H01L 23/4006 |
| | | | | 257/676 |

FOREIGN PATENT DOCUMENTS

| | | | | |
|---|---|---|---|---|
| CN | 113690192 A | * | 11/2021 | ............ H01L 21/52 |
| DE | 102016202067 A1 | | 10/2016 | |
| EP | 3499560 A1 | * | 6/2019 | .......... H01L 21/568 |
| EP | 3736855 A1 | * | 11/2020 | ........ H01L 21/4817 |
| EP | 3499560 B1 | * | 8/2021 | .......... H01L 21/568 |
| EP | 3913665 A1 | * | 11/2021 | ............ H01L 21/52 |
| EP | 3929973 A1 | * | 12/2021 | .......... H01L 23/049 |
| EP | 4187596 A1 | * | 5/2023 | ........ H01L 21/4817 |
| JP | 2013058812 A | | 3/2013 | |
| WO | 2015037349 A1 | | 3/2015 | |
| WO | WO-2015037349 A1 | * | 3/2015 | .......... H01L 23/295 |

\* cited by examiner

POWER SEMICONDUCTOR MODULE ARRANGEMENT

TECHNICAL FIELD

The instant disclosure relates to a semiconductor module, and a method for producing the same

BACKGROUND

Power semiconductor module arrangements often include at least one semiconductor substrate arranged in a housing. A semiconductor arrangement including a plurality of controllable semiconductor elements (e.g., two IGBTs in a half-bridge configuration) is arranged on each of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer may optionally be attached to a base plate. The controllable semiconductor devices are usually mounted to the semiconductor substrate by soldering or sintering techniques. Such arrangements, however, are usually rather expensive and the costs for a power semiconductor arrangement are critical for many applications. Further, power semiconductor module arrangements may be damaged by moisture that might enter a housing of the power semiconductor module arrangement and damage the semiconductor elements or any other components inside the housing.

There is a need for a power semiconductor module that may be produced at reduced costs and, at the same time, provides an increased moisture resistance.

SUMMARY

A power semiconductor module arrangement includes two or more individual semiconductor devices, each semiconductor device comprising a lead frame, a semiconductor body that is arranged on the lead frame, and a molding material enclosing the semiconductor body and at least part of the lead frame. The power semiconductor module arrangement further comprises a frame surrounding the two or more semiconductor devices, and a casting compound at least partly filling a capacity within the frame, thereby at least partly enclosing the two or more individual semiconductor devices.

A method for producing a power semiconductor module arrangement includes arranging two or more individual semiconductor devices on a base layer, each semiconductor device comprising a lead frame, a semiconductor body that is arranged on the lead frame, and a molding material enclosing the semiconductor body and at least part of the lead frame. The method further comprises arranging a frame on the base layer such that the frame surrounds the two or more semiconductor devices, filling a first material into the capacity formed by the base layer and the frame, and hardening the first material, thereby forming a casting compound that at least partly fills the capacity, thereby at least partly enclosing the two or more individual semiconductor devices.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
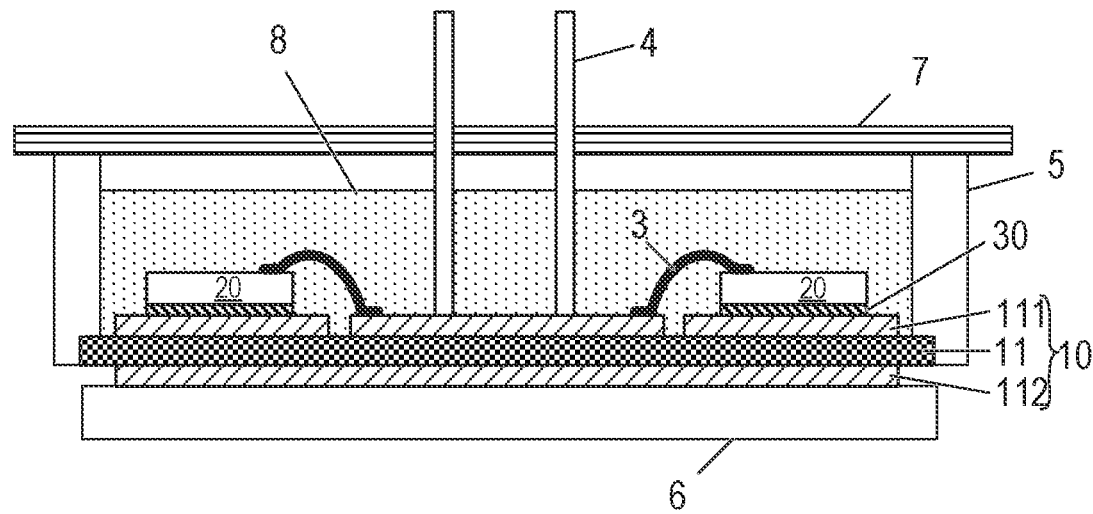
FIG. 1 is a cross-sectional view of a conventional power semiconductor module arrangement.

Referring to FIG. 1, a cross-sectional view of a power semiconductor module arrangement is illustrated. The power semiconductor module arrangement includes a semiconductor substrate 10. The semiconductor substrate 10 includes a dielectric insulation layer 11, a first (structured) metallization layer 111 attached to the dielectric insulation layer 11, and a second (structured) metallization layer 112 attached to the dielectric insulation layer 11. The dielectric insulation layer 11 is disposed between the first and the second metallization layer 111, 112.

The semiconductor substrate 10 is arranged in a housing 5. In the arrangement illustrated in FIG. 1, the semiconductor substrate 10 forms a ground surface of the housing 5, while the housing 5 itself solely comprises sidewalls. This is, however, only an example. It is also possible that the housing 5 further comprises a ground surface and/or a cover and that the semiconductor substrate 10 is arranged inside the housing 5.

One or more semiconductor bodies 20 may be arranged on the semiconductor substrate 10. The one or more semiconductor bodies 20 may form a semiconductor arrangement on the semiconductor substrate 10. In FIG. 1, only two semiconductor bodies 20 are exemplarily illustrated. The second metallization layer 112 of the semiconductor substrate 10 in FIG. 1 is a continuous layer. The first metallization layer 111 is a structured layer in the arrangement illustrated in FIG. 1. "Structured layer" means that the first metallization layer 111 is not a continuous layer, but includes recesses between different sections of the layer. Such recesses are schematically illustrated in FIG. 1. The first metallization layer 111 in this arrangement includes three different sections. Different semiconductor bodies 20 may be mounted to the same or to different sections of the first metallization layer 111. Different sections of the first metallization layer may have no electrical connection or may be electrically connected to one or more other sections using electrical connections 3 such as, e.g., bonding wires. Electrical connections 3 may also include connection plates or conductor rails, for example, to name just a few examples. The one or more semiconductor bodies 20 may be electrically and mechanically connected to the semiconductor substrate 10 by an electrically conductive connection layer 30. Such an electrically conductive connection layer 30 may be a solder layer, a layer of an electrically conductive adhesive, or a layer of a sintered metal powder, e.g., a sintered silver powder, for example.

The power semiconductor module arrangement further includes terminal elements 4. The terminal elements 4 are electrically connected to the first metallization layer 111 and provide an electrical connection between the inside and the outside of the housing 5. The terminal elements 4 may be electrically connected to the first metallization layer 111 with a first end, while a second end of the terminal elements 4 protrudes out of the housing 5. The terminal elements 4 may be electrically contacted from the outside at their second end.

For example, the second ends of the terminal elements 4 may be mechanically and electrically connected to a printed circuit board (PCB) 7. The printed circuit board 7 may form a cover of the housing and may comprise through holes. The terminal elements 4 may be inserted into the through holes of the printed circuit board 7. The printed circuit board 7 may comprise conducting tracks (not illustrated) and a terminal element 4 may be electrically coupled to one or more other terminal elements 4 by means of one or more such conducting tracks on the PCB 7. In this way, an electrical connection may be provided between different sections of the first metallization layer 111, between different semiconductor bodies 20, and/or between any other components that are arranged on the substrate 10. The terminal elements 4 may be soldered to the printed circuit board 7, for example, to provide for a permanent and solid connection. This, however, is only an example. According to another example, the lead frames 41 may include press-fit pins at their second ends which are inserted into corresponding counterparts of the printed circuit board 7. Any other suitable connections are also possible.

The housing 5 may be at least partly filled with a sealing resin 8. The sealing resin 8 may include a (filled) epoxy resin, silicone gel or other resin materials, for example. The sealing resin 8 is configured to seal the components of the power semiconductor module such as the semiconductor substrate 10, in particular the metal patterns formed by the first metallization layer 111, the semiconductor bodies 20, the electrical connections 3 and the terminal elements 4, to provide for insulation and protection of the devices. For example, the sealing resin 8 may protect the components from certain environmental conditions and from mechanical damage. The sealing resin 8 may at least partly fill the interior of the housing 5, thereby covering the components and electrical connections that are arranged on the semiconductor substrate 10. The terminal elements 4 may be partly embedded in the sealing resin 8. At least the second ends of the terminal elements 4, however, are not covered by the sealing resin 8 and protrude from the sealing resin 8 to the outside of the housing 5.

The power semiconductor module may further include a heat sink 6. The semiconductor substrate 10 may be connected to the heat sink via a connection layer (not illustrated). Such a connection layer may be a solder layer, a layer of an adhesive, or a layer of a sintered metal powder, e.g., a sintered silver powder, for example.

FIG. 1 schematically illustrates a power semiconductor arrangement without a base plate. However, the semiconductor substrate 10 may also be mounted on a base plate 9. The base plate 9 may be arranged on a heat sink 6 such that the base plate 9 is arranged between the heat sink 6 and the semiconductor substrate 10. In some power semiconductor module arrangements 100, more than one semiconductor substrate 101, 102 is arranged on a single base plate 9. This is exemplarily illustrated in FIG. 2. The base plate 9, instead of the semiconductor substrate 10, may then form a ground surface of the housing 5, for example. Semiconductor bodies 20 may be arranged on one or more of the semiconductor substrates 101, 102.

Such power semiconductor modules, as have been described with reference to FIGS. 1 and 2 above, however, are relatively expensive. There is generally a high pressure to reduce the costs of power semiconductor modules. Therefore, other power semiconductor module arrangements are known which include discrete semiconductor devices 21. Such discrete semiconductor devices 21 each include a semiconductor body 20 individually molded with a molding material 81. As is schematically illustrated in FIG. 3, the semiconductor body 20 of an individual semiconductor device 21 is arranged on an electrical carrier or lead frame 41. The lead frame 41 may include a metal such as copper, for example. The lead frame 41 may be at least partly molded into the molding material 81 and may form a bottom side of the semiconductor device 21. In FIG. 3, the lead frame 41 is illustrated as an L-shaped connecting element. On a first leg of the L, the semiconductor body 20 is arranged. The semiconductor body 20 may be attached to the lead frame 41 using an electrically conductive layer. Such an electrically conductive layer may be a solder layer, a layer of an electrically conductive adhesive, or a layer of a sintered metal powder, e.g., a sintered silver powder, for example. Alternatively or additionally, the semiconductor body 20 may be electrically connected to the lead frame 41 using an electrical connection such as a bonding wire 3, for example. The second leg of the lead frame 41 may be mechanically and electrically connected to a printed circuit board 7. The printed circuit board 7 may provide for an electrical connection between two or more semiconductor devices 21 that are connected to the same printed circuit board 7, as has already been described above with respect to FIG. 1. Each semiconductor device 21 is arranged on an individual heat sink 6.

Figure 2:
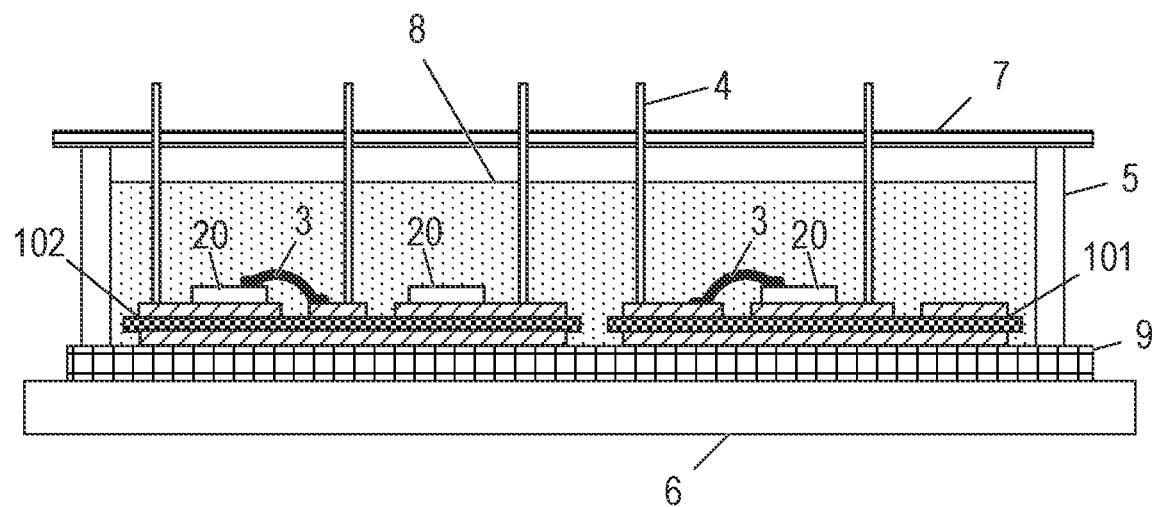
FIG. 2 is a cross-sectional view of another conventional power semiconductor module arrangement.
Figure 3:
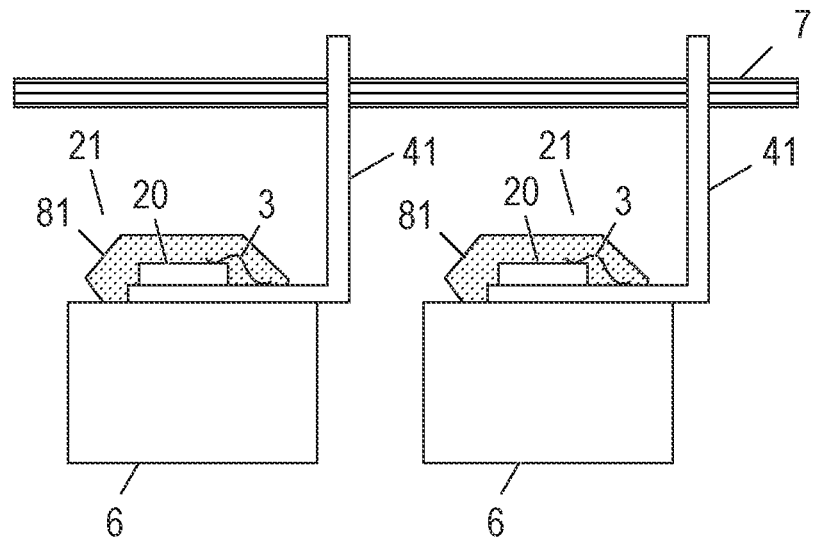
FIG. 3 is a cross-sectional view of another conventional power semiconductor module arrangement.

The installation effort of such a power semiconductor module arrangement including several discrete semiconductor devices 21, therefore, is high as compared to the arrangements that have been described with respect to FIGS. 1 and 2. In the arrangement of FIG. 3, each semiconductor device 21 has to be individually assembled and has subsequently be connected to the printed circuit board 7 and to an individual heat sink 6. Usually, a layer of electrically isolating material (not illustrated) is arranged between the lead frame 41 of each semiconductor device 21 and the respective heat sink 6. The layer of electrically isolating material usually has to be applied before the heat sink 6 is mounted to the lead frame 41. The lead frames 41 with the semiconductor bodies 20 mounted thereon are usually not equipped with such an isolation layer when sold to an end customer. This further increases the installation effort for the end customer, as he needs to perform an extra step to form an isolation layer between the semiconductor devices 21 and the heat sinks 6. Furthermore, such dielectric isolation layers usually have a poor thermal resistance. Even further, an arrangement as illustrated in FIG. 3 might only be slightly more cost-efficient than the arrangements of FIGS. 1 and 2. This is, because the mounting process of the semiconductor devices 21 for the arrangement of FIG. 3 is more cost intensive than the mounting process of the semiconductor devices 20 of FIG. 1. However, the packaging costs for the semiconductor devices of the arrangement of FIG. 3 are by factors cheaper than the packaging costs for the semiconductor devices of the arrangement of FIG. 1.

Figure 4:
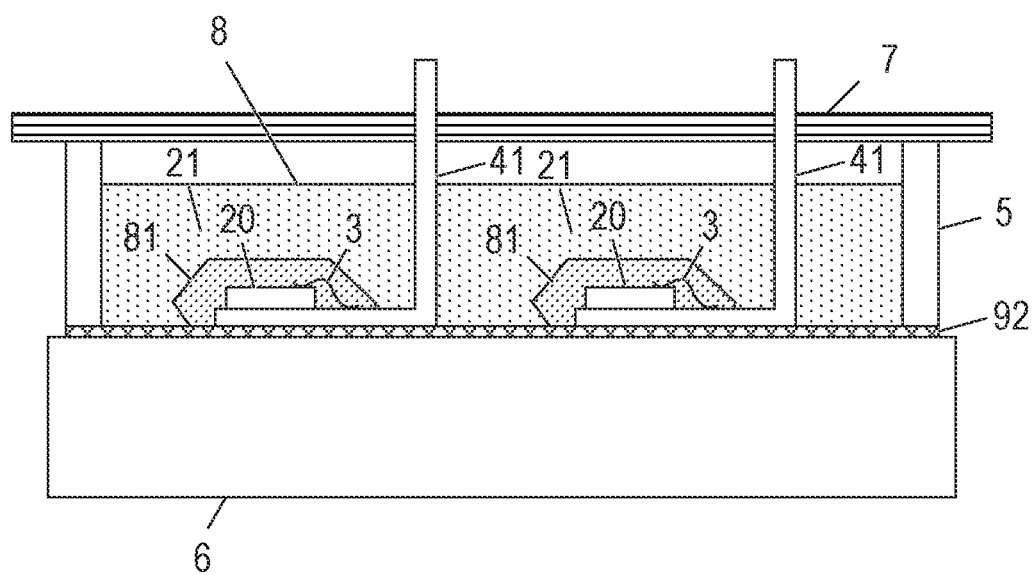
FIG. 4 is a cross-sectional view of a power semiconductor module arrangement.

Now referring to FIG. 4, a power semiconductor module arrangement is exemplarily illustrated. The power semiconductor module arrangement includes two or more discrete semiconductor devices 21. Each discrete semiconductor device 21 includes a semiconductor body 20 and a lead frame 41. Each of the semiconductor bodies 20 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable controllable semiconductor element. As has been explained with respect to FIG. 3 above, the lead frame 41 may have an L-shape, for example. This means that the lead frame 41 may include a first leg and a second leg. The first leg may be arranged essentially perpendicular to the second leg. This, however, is only an example. The lead frame 41 generally may have any other suitable shape.

One semiconductor body 20 is arranged on the lead frame 41, e.g., on the first leg of an L-shaped lead frame 41. The semiconductor body 20 may be attached to the lead frame 41 using an electrically conductive layer. Such an electrically conductive layer may be a solder layer, a layer of an electrically conductive adhesive, or a layer of a sintered metal powder, e.g., a sintered silver powder, for example. The semiconductor body 20, however, may also be mounted to the lead frame 41 via an electrically non-conductive layer. Alternatively or additionally to an electrically conductive layer, the semiconductor body 20 may be electrically connected to the lead frame 41 using an electrical connection such as a bonding wire 3, for example. The lead frame 41, e.g., the second leg of the lead frame 41 may be mechanically and electrically connected to a printed circuit board 7. The printed circuit board 7 may provide for an electrical connection between two or more semiconductor devices 21 that are connected to the same printed circuit board 7. When an L-shaped lead frame 41 is connected to the printed circuit board 7, the first leg of the lead frame 41 may be essentially parallel to the main surface of the printed circuit board 7 and the second leg of the lead frame 41 may be essentially perpendicular to the main surface of the printed circuit board 7 and to the first leg of the lead frame 41. The first legs of different individual lead frames 41 may be arranged in the same plane. This means, that a distance between the first legs of different lead frames 41 and the printed circuit board 7 is essentially equal. The connections between the lead frames 41 and the printed circuit board 7 may include solder connections, press-fit connections or any other suitable connections, as has been described with reference to FIG. 1 above.

A semiconductor body 20, any electrical connections 3 of the semiconductor device 21, and at least part of the corresponding lead frame 41 to which the semiconductor body 20 is mounted may be molded into a molding material 81. The molding material 81 may be a hard encapsulation material, for example. This means that the molding material 81, when hardened, has a certain hardness. The first leg of the lead frame 41 may form a bottom side of the semiconductor device 21. A bottom side of the semiconductor body 20 may be arranged on and connected to the lead frame 41. All other surfaces of the semiconductor body 20 may be surrounded by the molding material 81.

The two or more discrete semiconductor devices 21 are arranged within a housing 5. The housing 5 may include at least sidewalls, as is exemplarily illustrated in FIG. 4. The sidewalls of the housing 5 may form a frame. Optionally, the housing 5 may also include a ground surface and/or a cover. The individual semiconductor devices 21 are arranged within the housing 5 such that the lead frames 41 protrude from the housing 5 at defined positions. In this way, the printed circuit board 7 may be easily connected to the lead frames 41 at a later stage. In the example illustrated in FIG. 4, the individual semiconductor devices 21 are mounted on a heat sink 6. As compared to the arrangement of FIG. 3, all individual semiconductor devices 21 are mounted to the same heat sink 6. The heat sink 6, therefore, forms a continuous ground surface of the housing 5 in the illustrated example. A layer of isolating material 92 may be arranged on the heat sink 6. The individual semiconductor devices 21 may be arranged on the layer of isolating material 92 such that the layer of isolating material 92 is arranged between the individual semiconductor devices 21 and the heat sink 6. When the semiconductor devices 21 are mounted on the heat sink 6, the separate lead frames 41 are arranged between the respective semiconductor bodies 20 and the layer of isolating material 92. Heat sinks 6 often include a metal or other electrically conductive materials. The layer of isolating material 92 dielectrically isolates the semiconductor devices 21 from the heat sink 6 and, therefore, also dielectrically isolates the semiconductor devices 21 from each other. In this way, any unwanted electrical connections between different semiconductor devices 21 may be prevented. Electrical connections between individual semiconductor devices 21 may be only provided via the printed circuit board 7, for example.

The capacity that is formed by the housing 5 and the heat sink 6 may be at least partly filled with a casting compound 8. The casting compound 8 may include a (filled) epoxy resin, a silicone, a polymer, or any other suitable casting material, for example. The casting compound 8 may comprise a material that includes fillers such as $Al_2O_3$, $Si_2O$, BrN, or AlN, for example. The casting compound 8 may have a hardness that is in the range of or less than the hardness of the molding material 81. The molding material 81 may also include fillers such as $Al_2O_3$, $Si_2O$, BrN, or AlN, for example. Generally, the molding material 81 and the material of the casting compound 8 may be the same and/or include the same fillers, but may differ from each other in their hardness. By filling the housing 5 with the semiconductor devices 21 arranged therein with a casting compound 8, the semiconductor bodies 20 are very well protected against any environmental influences and environmental conditions by the molding material 81 and the additional casting compound 8. Furthermore, the power semiconductor module arrangement may be manufactured in a comparatively cost-effective way. The printed circuit board 7 may be arranged on the semiconductor module arrangement after forming the casting compound 8, for example.

Figure 5:
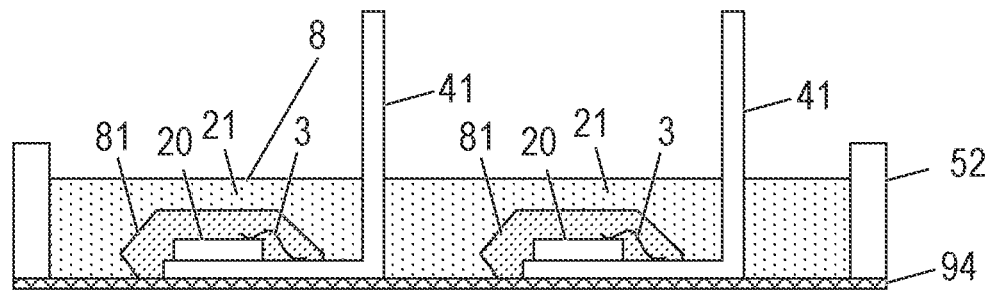
FIG. 5 schematically illustrates one step of a method for producing a power semiconductor module arrangement.

Now referring to FIG. 5, a power semiconductor module arrangement is schematically illustrated before mounting it to a printed circuit board and to a heat sink. For example, the individual semiconductor devices 21 may first be arranged on a base layer 94. The base layer 94 may be or may include an adhesive foil, for example. When arranged on an adhesive foil, the semiconductor devices 21 may adhere to the foil and, therefore, may be held in place on the base layer 94. A frame 52 may be arranged to surround the semiconductor devices 21. The capacity formed by the frame 52 and the base layer 94 may then be at least partly filled with casting compound 8. When filling the material forming the casting compound 8 into the capacity within the frame 52, the material may have a liquid, viscous or gel-like consistence, for example. In a following hardening step, at least some of the fluid may be removed from the material, thereby hardening the casting compound 8. This, however, is only an example. The material forming the casting compound 8 may include solvents that are at least partly removed in a hardening step. According to another example, the material forming the casting compound 8 does not include any solvents and the hardening step comprises performing polymer reactions.

According to another example, the base layer 94 does not include an adhesive foil. If the semiconductor devices 21 do not adhere to the base layer 94, they may shift and may not be held in place when the material forming the casting compound 8 is filled into the capacity within the frame 52. Therefore, retaining devices 72 may be used to hold the semiconductor devices 21 in place. This is exemplarily illustrated in FIG. 6. The retaining devices 72 may be configured to press the semiconductor devices 21 to the base layer 94, thereby holding the semiconductor devices 21 in their respective positions. The material forming the casting compound 8 may be filled into the capacity formed by the frame 52 and the base layer 94 and may consequently be hardened as has been explained with respect to FIG. 5 above.

Figure 6:
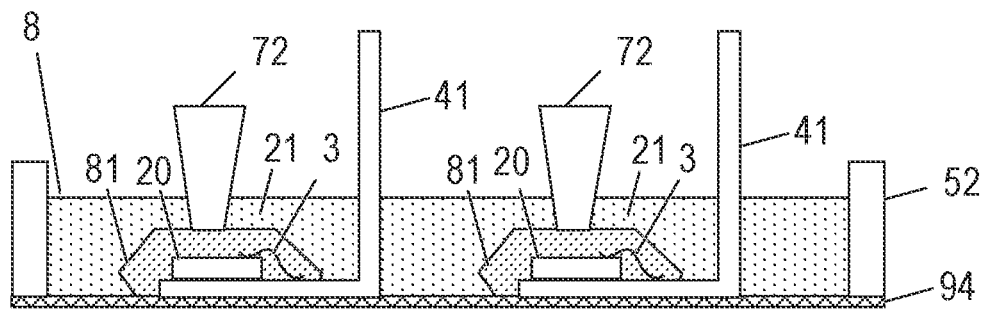
FIG. 6 schematically illustrates one step of a method for producing a power semiconductor module arrangement.
Figure 7:
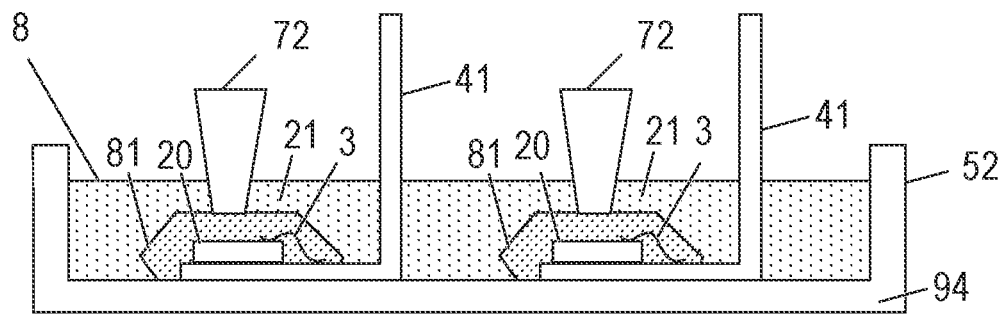
FIG. 7 schematically illustrates one step of a method for producing a power semiconductor module arrangement.

It is, however, also possible that the frame 52 and the base layer 94 are not provided as separate components, as has been described with respect to FIGS. 5 and 6. The frame 52 and the base layer 94 may form a continuous mold, as is schematically illustrated in FIG. 7. This means that the frame 52 and the base layer 94 are integrally formed from the same material. The semiconductor devices 21 may be arranged within this mold while forming the casting compound 8. The mold may comprise a bottom (base layer 94) and sidewalls (frame 52), for example. The semiconductor devices 21 may be arranged on the bottom of the mold and may be held in their respective positions by means of retaining devices 72, as has been explained with respect to FIG. 6 above. The material forming the casting compound 8 may be filled into the capacity that is formed by the mold. After filling the material into the capacity, the material may subsequently be hardened to form the casting compound 8. The arrangement including the hardened casting compound 8 with the semiconductor devices 21 molded therein may then be removed from the mold.

Figure 8A:
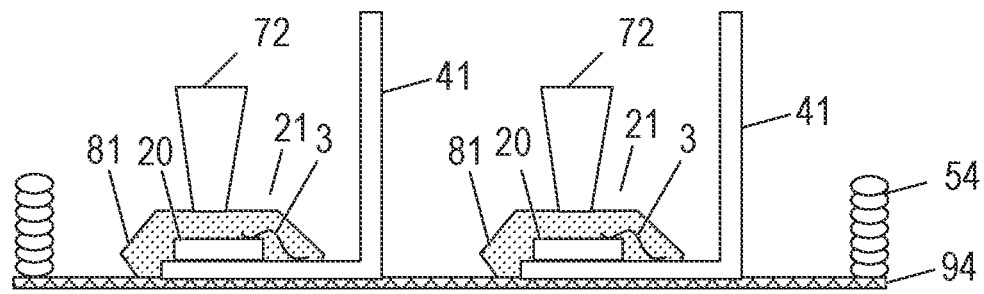
FIGS. 8A and 8B schematically illustrate respective steps of a method for producing a power semiconductor module arrangement.
Figure 8B:
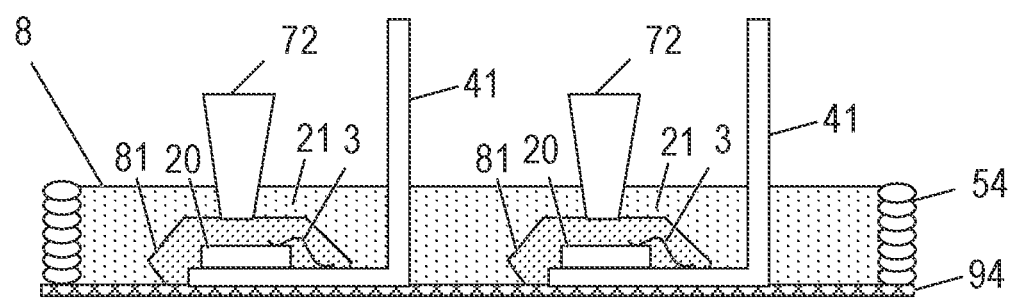

FIGS. 5 to 7 exemplarily illustrate different alternative ways for forming the casting compound 8. An even further exemplary method is illustrated in FIGS. 8A and 8B. The semiconductor devices 21 may be arranged on a base layer 94. The frame 5 and the casting compound 8 in this example are formed by a so-called Dam and Fill process. As is schematically illustrated in FIG. 8A, a dam or wall 54 may be formed in a first step. The dam 54 may surround the semiconductor devices 21 that are arranged on the base layer 94. The dam 54 corresponds to the frame 5 in the examples of FIGS. 5 to 7. This means that a capacity is formed by the dam 54 and the base layer 94. The semiconductor devices 21 are arranged on the base layer 94 within this capacity. The dam 54 may include any suitable Dam and Fill material such as a filled epoxy resin, for example. The dam 54 may include a single layer of material or may include several layers of material that are arranged on top of each other, as is schematically illustrated in FIGS. 8A and 8B. In a subsequent step after forming the dam 54, the capacity formed by the dam 54 and the base layer 94 is filled with the material forming the casting compound 8, as is schematically illustrated in FIG. 8B. As has been described with reference to FIGS. 5 to 7 above, after filling the material into the capacity, the material may subsequently be hardened to form the casting compound 8 with the semiconductor devices 21 molded therein. During the Dam and Fill process, retaining devices 72 may be used to hold the semiconductor devices 21 in place on the base layer 94. It is, however, also possible that the base layer 94 includes an adhesive foil, as has been described with respect to FIG. 5 above, and that, therefore, no retaining devices 72 are needed to hold the semiconductor devices 21 in place.

When forming the casting compound 8, especially when hardening the material inside the capacity, the bottom surface of the casting compound 8 may be distorted. This means, that after hardening the casting compound 8, the bottom surface may not be completely plane and may have a certain deflection. It is also possible that a deflection of the casting compound 8 occurs at a later stage during operation of the power semiconductor module arrangement. To prevent such deflections of the power semiconductor module arrangement, the casting compound 8 may have an expansion coefficient that is similar to the expansion coefficient of the molding material 81. For example, the expansion coefficient of the molding material 81 and the expansion coefficient of the casting compound 8 may be between 5 and 40 ppm/K, or between 10 and 20 ppm/K, for example.

Figure 9A:
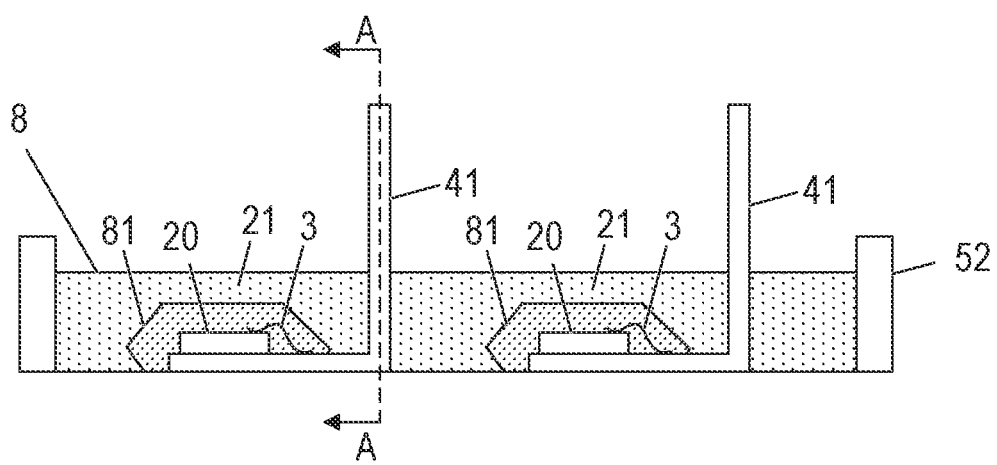
FIGS. 9A to 9C schematically illustrate respective steps of a method for producing a power semiconductor module arrangement.
Figure 9B:
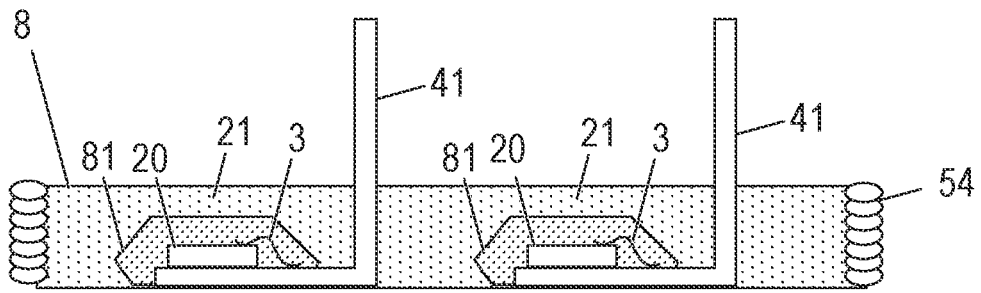
Figure 9C:
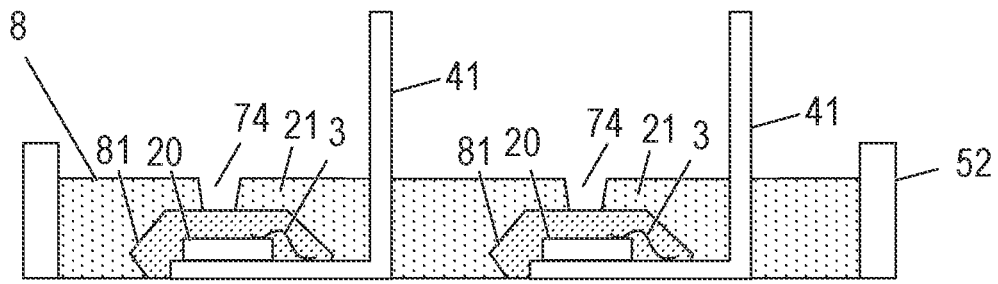

Now referring to FIGS. 9A through 9C, the base layer 94 may be removed after forming the casting compound 8. FIG. 9A exemplarily illustrates the arrangement of FIG. 5, wherein the base layer 94 has been removed. The frame 52 may be removed as well (not illustrated) or may still be attached to the casting compound 8 as is illustrated in FIG. 9A. FIG. 9B exemplarily illustrates the arrangement of FIGS. 8A and 8B, wherein the base layer 94 has been removed and wherein the dam 54 remains attached to the casting compound 8. FIG. 9C exemplarily illustrates the arrangement of FIG. 6, wherein the base layer 94 has been removed. As can be seen in the example illustrated in FIG. 9C, the casting compound 8 may include recesses 74. This is, because the retaining devices 72 are removed after forming the casting compound 8. No material may get to those places where the retaining devices 72 are arranged during the steps of forming the casting compound 8. However, as the semiconductor bodies 20 are individually molded in the molding material 81, the recesses 74 do not necessarily have to be filled with material after removing the retaining devices 72. The semiconductor bodies 20 may be protected enough by the molding material 81 and the casting compound 8 which covers most of the external surface of the semiconductor devices 21. However, if desired, the recesses 74 may subsequently be filled with material. The material that is used to fill the recesses 74 may be the same material as the material forming the casting compound 8.

As has been described above, a method for producing a power semiconductor module may include the following steps. In a first step, the semiconductor devices 21 may be arranged on a base layer 94 and a frame 52 may be arranged to surround the semiconductor devices 21 on the base layer 94. The frame 52 may include the sidewalls of a mold or a dam 54, for example. Generally speaking, the frame 52 may be any structure that is suitable to form a capacity with the base layer 94 and hold the material forming the casting compound 8. In a subsequent step, the material forming the casting compound 8 is filled into the capacity formed by the frame 52 and the base layer 94. The material at least partly fills the capacity. In a following step, the material is hardened to form the casting compound 8. When the casting compound 8 has been hardened, the base layer 94 may be removed. It is, however, also possible that the base layer 94 remains attached to the power semiconductor module arrangement. The frame 52 may either be removed or may remain attached to the power semiconductor module arrangement. If the frame 52 is removed after forming the casting compound 8, the casting compound 8 with the semiconductor devices 21 molded therein may subsequently be arranged in another frame or a housing 5, for example. If the frame 52 is not removed, the frame 52 itself may subsequently form a housing 5 of the power semiconductor module arrangement.

Figure 10:
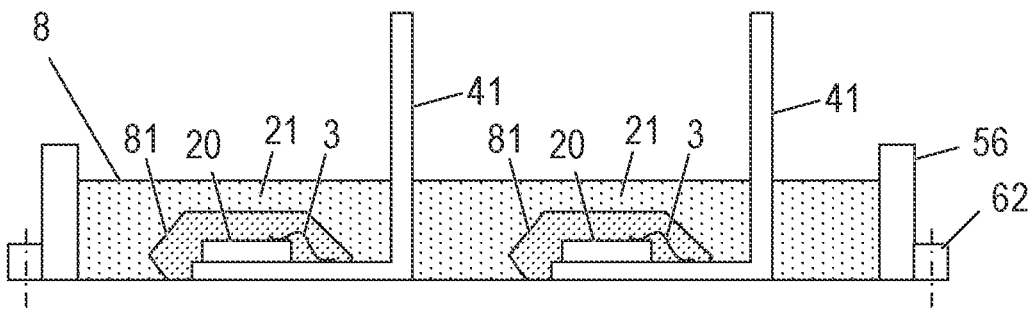
FIG. 10 schematically illustrates one step of a method for producing a power semiconductor module arrangement.

Now referring to FIG. 10, a power semiconductor module arrangement is schematically illustrated. In the power semiconductor module arrangement of FIG. 10, the semiconductor devices 21 that are molded in the casting compound 8 are arranged within a housing 56. Fastening elements 62 may be attached to the housing 56. The fastening elements 62 may be used to attach the power semiconductor module arrangement to a heat sink (not illustrated in FIG. 10). For example, the fastening elements 62 may each include a threaded hole. A screw may be inserted into each of the threaded holes to fix the arrangement on a heat sink. The heat sink may include corresponding threaded holes in which the screws may be inserted. However, the power semiconductor module arrangement may be attached and fixed to a heat sink in any other suitable way. The fastening elements 62 may be attached to the housing 56 before or after forming the casting compound 8. As is illustrated in the example of FIG. 10, the fastening elements 62 may be attached to the outside of the housing 56. The fastening elements 62 may be glued or screwed to the housing 56, for example. The fastening elements 62, however, may also be integrally formed with the housing 56. These, however, are only examples. The fastening elements 62 may be attached to the housing 56 (or frame 52) in any other suitable way.

Figure 11:
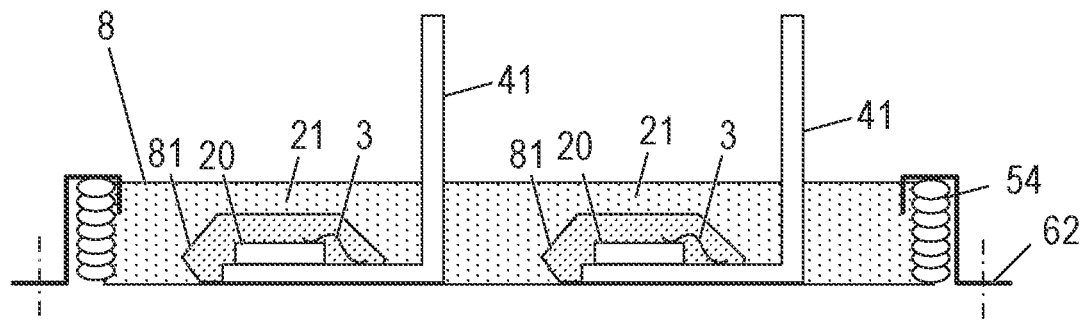
FIG. 11 schematically illustrates one step of a method for producing a power semiconductor module arrangement.

Referring to FIG. 11, a power semiconductor module arrangement is exemplarily illustrated that has been formed using a Dam and Fill process, as has been described with respect to FIGS. 8A and 8B above. The fastening elements 62 in this example include a first part that is molded into the casting compound 8, and a second part that is configured to be connected to a heat sink. The fastening elements 62 may be molded into the casting compound 8 when the casting compound 8 is formed. The fastening elements 62 may encompass the frame or dam 54 such that one part of the fastening elements 62 is arranged in the capacity formed by the frame or dam 54 and the base layer 94 and a second part of the fastening elements 62 is arranged on the other side of the frame or dam 54. When the material forming the casting compound 8 is filled into the capacity, the first part of the fastening element 62 may protrude into the material such that it is molded into the casting compound 8 when hardening the material. In FIG. 11, such an arrangement is exemplarily illustrated for an arrangement including a dam 54. This, however, is only an example. A fastening element 62 as described in FIG. 11 may be combined with any other kind of frame 52 or mold.

Figure 12:
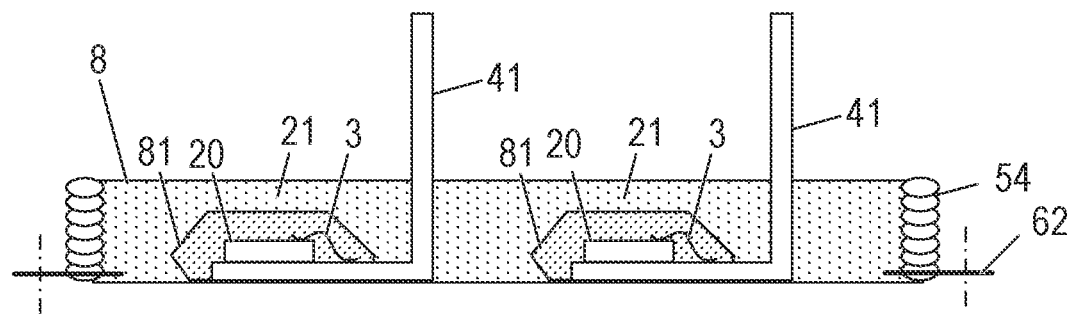
FIG. 12 schematically illustrates one step of a method for producing a power semiconductor module arrangement.

If a dam and fill process is used to form the casting compound 8, the fastening elements 62 may also be arranged to protrude through the dam 54, as is exemplarily illustrated in FIG. 12. For example, the fastening elements 62 may be placed in their intended positions while forming the dam 54. For example, one or more layers of material may be deposited on the base layer 94. The fastening elements 62 may then be placed on the only partly finished dam 54, before depositing further layers of material to finish the dam 54. In this way, the fastening elements 62 are at least partly embedded in the material forming the dam 54. A first part of the fastening elements 62 may protrude and may be molded into the casting compound 8. A second part of the fastening elements 62 may protrude to the outside of the arrangement and may be configured to be attached to a heat sink.

The fastening elements 62 as described in FIGS. 11 and 12 may also include a threaded hole. A screw may be inserted into the threaded hole to fix the arrangement on a heat sink. The heat sink may include corresponding threaded holes in which the screw may be inserted. However, the power semiconductor module arrangement may be attached and fixed to a heat sink in any other suitable way.

Figure 13:
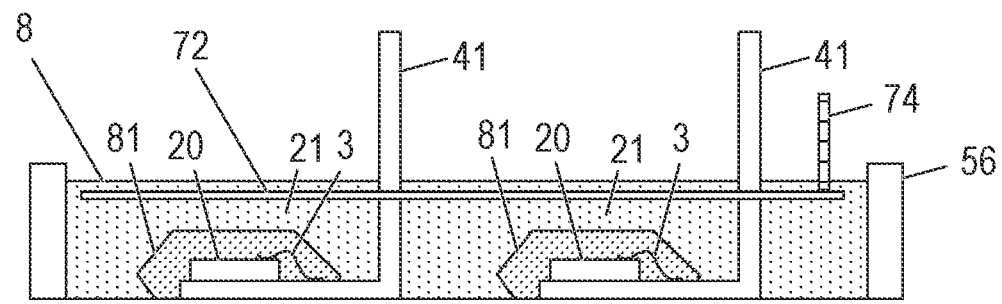
FIG. 13 schematically illustrates one step of a method for producing a power semiconductor module arrangement.

Now referring to FIG. 13, the power semiconductor module arrangement may further include a contact collector device. The contact collector device may include a metal sheet 72, for example. The metal sheet 72 may be molded into the casting compound 8 and may electrically contact one or more of the lead frames 41. The contact collector device 72 may further include a connector pin 74. The connector pin 74 may be configured to electrically contact the metal sheet 72 from the outside. Therefore, a first end of the connector pin 74 may be electrically and mechanically connected to the metal sheet 72 and may be molded into the casting compound 8. A second end of the connector pin 74 may protrude out of the casting compound 8 to allow the metal sheet 72 to be electrically contacted. The connector pin 74 may be arranged essentially parallel to the second legs of the lead frames 41, for example. The contact collector device, therefore, is configured to provide an electrical connection between two or more semiconductor devices 21. In FIG. 13 one contact collector device is exemplarily illustrated. However, a power semiconductor module arrangement may also include more than one contact collector device, each contact collector device electrically coupling two or more semiconductor devices 21. The contact collector device may include a gate collector or an emitter collector, for example. A gate collector, for example, may be configured to electrically connect the gate terminals of two or more semiconductor devices 21. An emitter collector, for example, may be configured to electrically connect the emitter terminals of two or more semiconductor devices 21.

Figure 14:
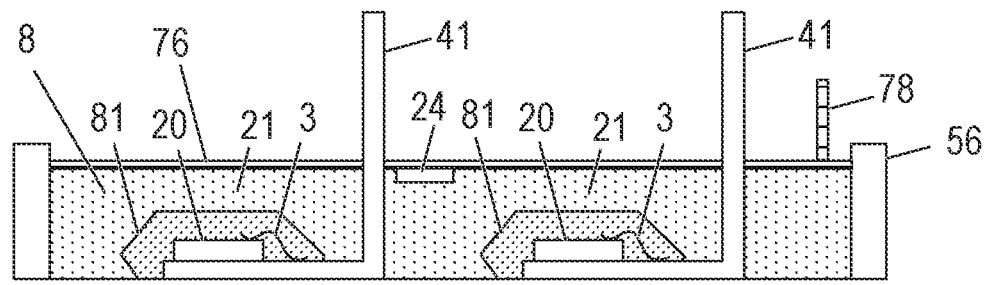
FIG. 14 schematically illustrates one step of a method for producing a power semiconductor module arrangement.

Now referring to FIG. 14, the power semiconductor module arrangement may include an electronic board 76. The electronic board 76 may be configured to provide electrical connections between two or more semiconductor devices 21. Similar to the contact collector device that has been described with respect to FIG. 13, a connector pin 78 may be connected to the electronic board 76. The connector pin 78 may be configured to provide a terminal to electrically contact the electronic board 76. The connector 78 pin may be arranged essentially parallel to the second legs of the lead frames 41. The electronic board 76 may comprise electronic lines (not illustrated) that are configured to electrically connect two or more semiconductor devices 21 with each other. The electronic board 76 may be molded into the casting compound 8 (not illustrated) or may be arranged on an upper surface of the casting compound 8. When arranged on an upper surface of the casting compound 8, the electronic board 76 may form a lid of the power semiconductor module arrangement. A driver device 24 may be mounted to the electronic board 76. The driver device 24 may be electrically connected to at least one of the semiconductor devices 21 via the electronic board 76 and may be configured to control the at least one semiconductor device 21. This, however, is only an example. A driver device alternatively may be an external device and may be connected to the semiconductor devices 21 via the connector pin 78 and the electronic board 76.

Figure 15:
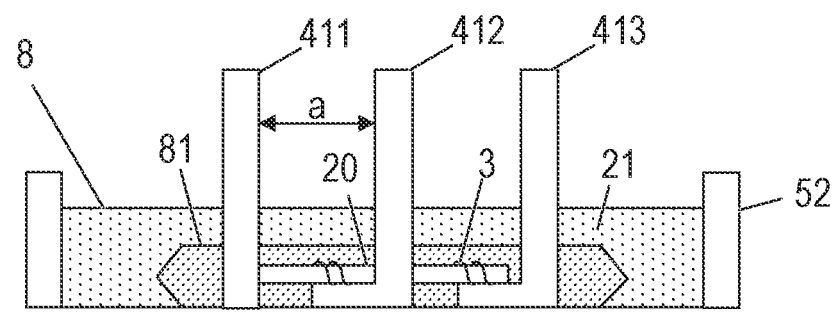
FIG. 15 schematically illustrates a cross-sectional view of a power semiconductor module arrangement in a section plane A-A as illustrated in FIG. 9A.

Now referring to FIG. 15, a lead frame 41 may include more than one first leg and more than one second leg. FIG. 15 exemplarily illustrates the arrangement of FIG. 9A in a section plane A-A. As is illustrated in FIG. 15, the lead frame 41 may include more than one lead frame component. In the example of FIG. 15, three different lead frame components 411, 412, 413 are exemplarily illustrated. For example, the semiconductor device 21 may include an IGBT. A first lead frame component 411 may electrically contact a gate of the IGBT, a second lead frame component 412 may electrically contact an emitter of the IGBT, and a third lead frame component 413 may electrically contact a collector of the IGBT. An electrical connection 3 between the semiconductor body 20 and the lead frame devices 411, 412, 413 may include bonding wires, for example. The lead frame devices 411, 412, 413 may be arranged essentially parallel to each other. The lead frame devices 411, 412, 413 may not be electrically connected to each other. One lead frame device 411, 412, 413 of one semiconductor device 21, however, may be electrically connected to a lead frame device 411, 412, 413 of another semiconductor device 21. Such an electrical connection may include a contact collector device or an electronic board, for example.

Figure 16:
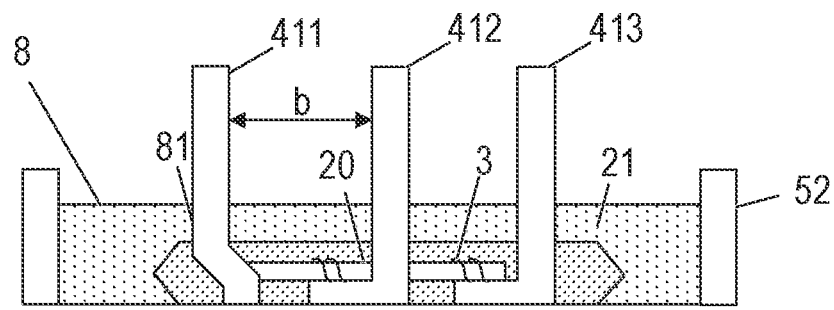
FIG. 16 schematically illustrates a cross-sectional view of another power semiconductor module arrangement in a section plane A-A as illustrated in FIG. 9A.

A lead frame device may be arranged at a certain distance a from a neighboring lead frame device. In FIG. 15 this is exemplarily illustrated for a first lead frame device 411 and a second lead frame device 412. In FIG. 15, the second legs of the lead frame devices 411, 412, 413 are essentially straight in a direction perpendicular to a main surface of the semiconductor body 20 and the casting compound 8. This, however, is only an example. In order to increase creepage distances and air gaps between two neighboring lead frame devices 411, 412, 413, one or more lead frame devices 411, 412, 413 may be bent. For example, the second end of a lead frame device 411 may be bent such that a distance b between the second end of the lead frame device 411 and a second end of a neighboring lead frame device 412 is greater than the original distance a. This is exemplarily illustrated in FIG. 16. The bending point of the lead frame device 411 may be molded into the casting compound 8.

The power semiconductor module arrangement may subsequently be mounted to a heat sink 6. Some semiconductor devices 21 already provide a dielectric isolation layer 92. Such a dielectric isolation layer may be arranged on a bottom side of the semiconductor device 21. This is, a side of the semiconductor device 21 that faces the heat sink 6 when mounted to the heat sink 6. Other semiconductor devices 21, however, do not provide such a dielectric isolation layer 92. A dielectric isolation layer 92 may then be formed before mounting the power semiconductor arrangement on a heat sink 6. The dielectric isolation layer 92 may either be formed on the heat sink 6 and the power semiconductor module may subsequently be arranged on the heat sink 6 such that the dielectric isolation layer 92 is arranged between the power semiconductor module arrangement and the heat sink 6. It is, however, also possible that a dielectric isolation layer 92 is formed on a bottom side of the power semiconductor arrangement and the power semiconductor arrangement is then arranged on the heat sink 6 such that the dielectric isolation layer 92 is arranged between the power semiconductor arrangement and the heat sink 6. A dielectric isolation layer 92 may be formed in any suitable way. For example, the dielectric isolation layer 92 may comprise a foil that is laminated or glued to the power semiconductor module arrangement and/or the heat sink 6. The dielectric isolation layer 92 may also be sprayed onto or molded to either the power semiconductor module arrangement or the heat sink 6. The dielectric isolation layer 92 may include an insulating lacquer, for example.

After forming the casting compound 8 and removing the base layer 94 from the power semiconductor module arrangement, a bottom side of the power semiconductor module arrangement may not be completely planar. The bottom side of the power semiconductor module arrangement is a side that faces the heat sink 6 when the power semiconductor module arrangement is mounted to the heat sink 6. If the bottom side is not completely planar, the connection between the power semiconductor module arrangement and the heat sink 6 may not be stable. Cavities might be formed between the power semiconductor module arrangement and the heat sink 6. This may adversely affect the heat transfer between the power semiconductor module arrangement and the heat sink 6. Therefore, the bottom side of the power semiconductor module arrangement may be polished before mounting the power semiconductor module arrangement to the heat sink 6.

Generally, the molding material 81 of the semiconductor devices 21 may be fully hardened before filling the material forming the casting compound 8 into the capacity formed by the frame 52 and the base layer 94. However, it is also possible that the molding material 81 is only pre-hardened before arranging them in the semiconductor arrangement and before filling the material forming the casting compound 8 into the capacity formed by the frame 52 and the base layer 94. That is, the molding material 81 may not be completely hardened. The molding material 81 may be fully hardened (post mold curing) at the same time when the casting compound 8 is hardened. Therefore, in one single hardening step, the casting compound 8 and the pre-hardened molding material 81 may be hardened.

Figure 17:
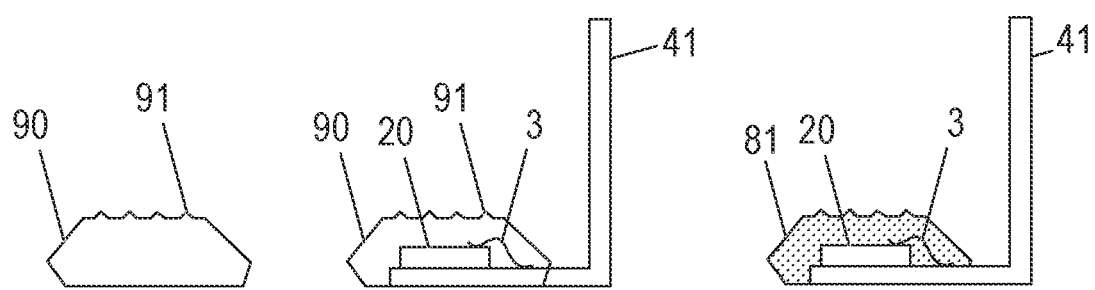
FIG. 17 schematically illustrates a casting mold for forming the molding material of a semiconductor device.

The semiconductor devices 21 may have a rough or roughened external surface, for example. An external surface of the semiconductor device 21 is a surface which comes into direct contact with the casting compound 8. In particular, an external surface of the molding material 81 may be rough. That is, the external surface is not completely smooth. In this way, the adherence between the semiconductor device 21 and the casting compound 8 may be increased. For example, the external surface of the semiconductor devices 21 may have an average surface roughness Rz of ≥16, for example. In order to roughen the surface of the semiconductor devices 21, the semiconductor devices 21 may be treated before arranging them in the semiconductor module. Treating the semiconductor bodies 21 may comprise sandblasting, chemically roughening, or forming of structures that protrude from the molding material 81. Such structures may be formed when forming the molding material 81, for example. FIG. 17, left side, exemplarily illustrates a casting mold 90. The casting mold 90 comprises bulges or protrusions on at least one side. When a lead frame 41 with a semiconductor body 20 arranged thereon is placed in the casting mold 90 (FIG. 17, middle) and the casting mold 90 is filled with the molding material 81, this results in the molding material 81 having protrusions or structures on at least one side (FIG. 17, right side). The casting mold 90 may comprise only one side having bulges or protrusions 91. The casting mold 90, however, may also comprise more than one side having bulges or protrusions 91. Such structures, however, may not have to be formed at the same time as the molding material 81, but may also be formed at a later stage.

The base layer 94 may comprise a first foil. The first foil may comprise a material such as filled epoxy resin, for example. The first foil may have a thickness of about 50-about 300 μm. The first foil may have a certain adhesion. The first foil may be arranged on a carrier foil, for example. The carrier foil may comprise a material such as a polymer, for example. It is, however, also possible that the carrier foil comprises a metal such as copper, for example. The carrier foil may have a thickness of about 30 to about 100 μm, for example. The semiconductor devices 21 may be arranged on the base layer 94 comprising the first layer and the carrier layer such that the first layer is arranged between the semiconductor devices 21 and the carrier layer. As has been described with respect to FIG. 5 above, for example, a frame 52 may be arranged to surround the semiconductor devices 21 arranged on the base layer 94. The capacity formed by the frame 52 and the base layer 94 may then be filled with a material forming the casting compound 8. A hardening step may follow to harden the casting compound 8, as has been described above. During the hardening step, the adhesive properties of the first foil may be increased. For example, the first foil may only be pre-hardened when arranging the semiconductor devices 21 on the first foil. When hardening the casting compound 8, the first foil may also be hardened. This may alter the adhesive properties of the first foil. The semiconductor devices 21, therefore, adhere very well to the base layer 94. To further increase the adhesion between the semiconductor devices 21 and the base layer 94, a lower surface of the semiconductor devices 21 may be roughened. Roughening the semiconductor bodies 21 may comprise sandblasting, chemically roughening, or forming of structures that protrude from the semiconductor devices 21, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module arrangement, comprising:
   two or more individual semiconductor devices arranged on a base layer, each semiconductor device comprising a lead frame, a semiconductor body arranged on the lead frame, and a molding material enclosing the semiconductor body and at least part of the lead frame;
   a frame arranged on the base layer such that the frame surrounds the two or more individual semiconductor devices; and
   a casting compound that at least partly fills a capacity formed by the base layer and the frame, such that the casting compound at least partly encloses the two or more individual semiconductor devices.

2. The power semiconductor module arrangement of claim 1, further comprising:
   a printed circuit board connected to the lead frames.

3. The power semiconductor module arrangement of claim 1, further comprising:
   a layer of electrically isolating material on a bottom side of the lead frames.

4. The power semiconductor module arrangement of claim 1, further comprising:
   a heat sink on which the casting compound is arranged.

5. The power semiconductor module arrangement of claim 1, wherein a lower surface of the casting compound is substantially coplanar with lower surfaces of the lead frames of each of the two or more individual semiconductor devices.

6. The power semiconductor module arrangement of claim 1, further comprising:
   fastening elements attached to the frame on a side of the frame that is opposite to a side of the frame that is in contact with the casting compound.

7. The power semiconductor module arrangement of claim 1, wherein the frame includes a dam and fill material.

8. The power semiconductor module arrangement of claim 1, wherein an external surface of the molding material has an average surface roughness Rz of 16 or more.

9. The power semiconductor module arrangement of claim 1, wherein the semiconductor body is mounted directly on the lead frame of each semiconductor device, wherein the lead frame of each semiconductor device is a continuous element, and wherein the continuous lead frame of each semiconductor device extends out from the molding material and the casting compound.

10. A power semiconductor module arrangement, comprising:
  two or more individual semiconductor devices arranged on a base layer, each semiconductor device comprising a lead frame, a semiconductor body arranged on the lead frame, and a molding material enclosing the semiconductor body and at least part of the lead frame;
  a frame surrounding the two or more individual semiconductor devices;
  a casting compound that at least partly fills a capacity formed by the base layer and the frame, such that the casting compound at least partly encloses the two or more individual semiconductor devices,
  wherein a lower surface of the casting compound is substantially coplanar with lower surfaces of the lead frames of each of the two or more individual semiconductor devices.

11. The power semiconductor module arrangement of claim 10, further comprising:
  a printed circuit board connected to the lead frames.

12. The power semiconductor module arrangement of claim 10, further comprising:
  a layer of electrically isolating material on a bottom side of the lead frames.

13. The power semiconductor module arrangement of claim 10, further comprising:
  a heat sink on which the casting compound is arranged.

14. The power semiconductor module arrangement of claim 10, further comprising:
  fastening elements attached to the frame on a side of the frame that is opposite to a side of the frame that is in contact with the casting compound.

15. The power semiconductor module arrangement of claim 10, wherein the semiconductor body is mounted directly on the lead frame of each semiconductor device, wherein the lead frame of each semiconductor device is a continuous element, and wherein the continuous lead frame of each semiconductor device extends out from the molding material and the casting compound.

* * * * *